United States Patent
Bogen et al.

(10) Patent No.: US 11,791,740 B2
(45) Date of Patent: Oct. 17, 2023

(54) POWER ELECTRONIC ARRANGEMENT WITH DC VOLTAGE CONNECTION ELEMENT AND METHOD FOR ITS PRODUCTION

(71) Applicant: SEMIKRON ELEKTRONIK GMBH & CO. KG, Nuremberg (DE)

(72) Inventors: Ingo Bogen, Nuremberg (DE); Florian Fink, Fürth (DE); Jürgen Steger, Hiltpoltstein (DE); Harald Kobolla, Seukendorf (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 435 days.

(21) Appl. No.: 17/219,276

(22) Filed: Mar. 31, 2021

(65) Prior Publication Data

US 2021/0336552 A1    Oct. 28, 2021

(30) Foreign Application Priority Data

Apr. 28, 2020   (DE) .................... 10 2020 111 573.3

(51) Int. Cl.
  *H02M 7/00*   (2006.01)
  *H01R 4/34*   (2006.01)
  *H01R 4/02*   (2006.01)

(52) U.S. Cl.
  CPC ............ *H02M 7/003* (2013.01); *H01R 4/029* (2013.01); *H01R 4/34* (2013.01)

(58) Field of Classification Search
  CPC ......... H02M 7/003; H01R 4/029; H01R 4/34; H01G 2/16; H01G 2/04; H01G 2/10; H01G 2/12
  See application file for complete search history.

(56) References Cited

U.S. PATENT DOCUMENTS 10,090,774 B1 * 10/2018 Beckedahl ............ H02M 7/003
2015/0325494 A1 * 11/2015 Kroneder .............. H01L 23/043
                                                                 361/715
(Continued)

FOREIGN PATENT DOCUMENTS

DE    102009043181 A1    4/2001
DE      2014115847 A1    5/2016
(Continued)

OTHER PUBLICATIONS

DE 10 2020 111 573.3, Search Report dated Mar. 13, 2023, 5 pages—German, 5 pages—English.

*Primary Examiner* — Michael P McFadden
(74) *Attorney, Agent, or Firm* — Andrew F. Young; Nolte Lackenbach Siegel

(57) ABSTRACT

A power converter module has a switching device with a substrate with a first and a second DC voltage conductor track and a first and a second DC voltage terminal element connected in an electrically conducting manner with the correct polarity, and having a first and a second DC voltage connection element. The first DC voltage terminal element is connected to the first DC voltage connection element in an electrically conducting manner with the correct polarity by means of a first materially-bonded connection, wherein the second DC voltage terminal element is connected to the second DC voltage connection element in an electrically conducting manner with the correct polarity by means of a second materially-bonded connection.

12 Claims, 6 Drawing Sheets

(56) References Cited

U.S. PATENT DOCUMENTS

2019/0020285 A1\* 1/2019 Kobolla ................. H01L 24/72
2021/0267086 A1\* 8/2021 Bogen ..................... H05K 5/02
2021/0336357 A1\* 10/2021 Steger .................... H01R 4/029

FOREIGN PATENT DOCUMENTS

| DE | 2016108562 A1 | 12/2016 | |
| DE | 102016108562 A1 \* | 12/2016 | ............ B23K 26/22 |
| DE | 102017109706 B3 | 3/2018 | |

\* cited by examiner

POWER ELECTRONIC ARRANGEMENT WITH DC VOLTAGE CONNECTION ELEMENT AND METHOD FOR ITS PRODUCTION

CROSS REFERENCE TO RELATED APPLICATIONS

This application relates to and claims priority to DE 10 2020 111 573.3 filed Apr. 28, 2020, the entire contents of which are incorporated herein by reference.

FIGURE SELECTED FOR PUBLICATION

FIG. 4

BACKGROUND OF THE INVENTION

Field of the Invention

The invention relates to a power electronic arrangement and a method for its production, having a power converter module which has a switching device with a substrate with a first and a second DC voltage conductor track and a first and a second DC voltage terminal element connected to said conductor tracks in an electrically conductive manner with the correct polarity, and having a first and a second DC voltage connection element, wherein the first DC voltage terminal element is connected to the associated DC voltage connection element in an electrically conductive manner with the correct polarity, and wherein the second DC voltage terminal element is connected to the second DC voltage connection element in an electrically conducting manner with the correct polarity.

Description of the Related Art

DE 10 2009 043 181 A1 discloses a power converter arrangement having a plurality of power converter assemblies with a cooling device, with power semiconductor modules and with one capacitor device per power converter assembly. In this case the power semiconductor module is arranged adjacent to the capacitor device. The DC load terminal elements of the power semiconductor module are connected by means of a planar busbar to the capacitor device, wherein the planar busbar is formed from a first and second metal shaped body with an insulating intermediate layer and this covers the capacitor device in at least one orientation. The busbars of two adjacent power converter assemblies can be connected to each other in in a low-inductance manner by the first metal shaped bodies being connected using a first connection body and first connection means and by the second metal shaped bodies being connected using a second connection body and second connection means. The first connection body is additionally covered by the second connection body.

DE 10 2017 109 706 B3 discloses a power electronic arrangement designed with a power converter module, with a first and a second DC voltage terminal element and a first and a second DC voltage connection element, each connected to said conductor tracks in an electrically conductive manner with the correct polarity, wherein always the first and second DC voltage terminal element, as well as the first and second DC voltage connection element, form a stack with an insulation device in each case arranged between them, the first DC voltage terminal element has a first opening enclosed thereby in a first main plane, the second DC voltage connection element has a second opening enclosed thereby and aligned with the first in a third main plane, the second DC voltage terminal element and the first DC voltage connection element are arranged in a second main plane, arranged between the first and third main plane, and are laterally spaced apart from each other in the region of the openings. In the arrangement a clamping device extends in an electrically isolated manner through the first and second opening, thus forming an electrically conducting clamped connection between the first DC voltage terminal element and the first DC voltage connection element, and between the second DC voltage terminal element and the second DC voltage connection element.

ASPECTS AND SUMMARY OF THE INVENTION

Having regard to the prior art referred to, one object of the invention is to present a power electronic arrangement with a power converter module and a method for its production, wherein the connection of DC voltage terminal elements of the power converter module to DC voltage connection elements for the external connection of the power converter module is implemented in a low-inductance manner and in a materially-bonded manner.

This object is achieved according to the invention by a power electronic arrangement having a power converter module, comprising a switching device with a substrate with a first and a second DC voltage conductor track and a first and a second DC voltage terminal element connected thereto in an electrically conducting manner with the correct polarity, and having a first and a second DC voltage connection element, wherein the first DC voltage terminal element is connected to the first DC voltage connection element in an electrically conducting manner with the correct polarity by means of a first materially-bonded connection, wherein the second DC voltage terminal element is connected to the second DC voltage connection element in an electrically conducting manner with the correct polarity by means of a second materially-bonded connection, wherein in the region of each of the connections between the DC voltage terminal element and the associated DC voltage connection element, the first and second DC voltage terminal element, as well as the first and second DC voltage connection element, each form a stack with an insulation device arranged between them when viewed in the normal direction.

The normal direction here is understood to mean the normal direction to the main surfaces of the respective terminal or connection elements in the region of the materially-bonded connections. These terminal and connection elements have respective surface connection sections there, which are also aligned in this normal direction. Here, the term 'oriented in the normal direction' is understood to mean both the positive and the negative normal direction.

Preferably, the respective materially-bonded connection is implemented as a welding joint, in particular as a laser welding joint.

It may be preferable if the first connection is spaced apart from the second connection perpendicular to the normal direction, i.e., laterally, and the connections do not have an overlap region with one another It may also be advantageous if either the first DC voltage terminal element or the first DC voltage connection element rests on a support device, which is preferably designed either as part of a housing of the switching device or as part of a cooling device, at least in the area of one of the connections. In this case, the first DC voltage terminal element or the first DC voltage connection element can be arranged on the support device in the region of, preferably directly adjacent to, the first connection by means of a clamping device. In this case, the clamping device can be designed as a screw connection and with an insulating sleeve at least partially surrounding the latter, and can thus pass in an electrically insulated manner through an opening of the first DC voltage terminal element and preferably also pass through a second opening of the second DC voltage connection element.

In particular, it is advantageous if the first DC voltage terminal element is arranged in a first main plane, the second DC voltage terminal and the first DC voltage connection element are arranged in a second main plane, and the second DC voltage connection element is arranged in a third main plane, or wherein the first DC voltage connection element is arranged in a first main plane, the second DC voltage connection element and the first DC voltage terminal element are arranged in a second main plane, and the second DC voltage terminal element is arranged in a third main plane and the main planes are stacked in the normal direction.

In principle, it can also be advantageous if the insulation devices of the two stacks overlap each other in the region between the first and second connections.

Each respective DC voltage terminal element is advantageously designed as a metal foil or metal sheet, with a thickness of preferably 300 μm to 2000 μm, particularly preferably of 500 μm to 1500 μm. It is also advantageous if the respective insulation device is made of a material from the material group of the plastics with high electrical dielectric strength, in particular from polyimide, ethylene tetrafluoroethylene copolymer or liquid crystal polymer, with a thickness of preferably 50 μm to 500 μm, particularly preferably of 75 μm to 150 μm.

In principle, the DC voltage connection elements can form the DC voltage supply of the power converter module and preferably be designed as part of a capacitor device.

The object is additionally achieved by a method for producing an arrangement according to any one of the preceding claims, having the following steps:
  a. arranging the power converter module with a first and a second DC voltage terminal element relative to a capacitor device with a first and second DC voltage connection element, in such a way that a surface connection section of the first DC voltage connection element hereby comes to rest on an associated surface connection section of the first DC voltage terminal element, and that a surface connection section of the first DC voltage terminal element or of the first DC voltage connection element located opposite an associated surface welding section is accessible to a welding device;
  b. forming the first connection by welding the first DC voltage connection element to the first DC voltage terminal element;
  c. arranging a surface connection section of the second DC voltage connection element on an associated surface connection section of the second DC voltage terminal element;
  d. forming the second connection by welding, in particular using a laser welding process, the second DC voltage connection element to the second DC voltage terminal element on a second surface welding section.

In doing so it may be preferable for the laser beams in both laser welding processes to act on the respective surface welding sections from the same, preferably a negative, normal direction.

In this case, it is advantageous if during step a) the DC voltage terminal elements or the DC voltage connection element are spaced apart in the area of their respective surface connection sections and are preferably at an angle to each other. In this case, it is additionally advantageous if in step c) the second DC voltage terminal element (52) or the second DC voltage connection element (62) is bent in a bending region.

The surface connection sections identify those sections of the terminal and connection elements within which the materially-bonded connection, i.e., the preferred laser welding joint, is formed. The respective surface welding sections identify those sections of the terminal and connection elements on which the laser acts to form the connections.

Of course, provided that this is not excluded inherently or explicitly, the features mentioned in the singular, in particular the power converter module, may also be present in a plurality in the arrangement according to the invention.

It goes without saying that the various embodiments of the invention can be implemented either individually or in any combination, in order to achieve improvements. In particular, the features mentioned and explained above and hereafter can be used not only in the combinations indicated but also in other combinations or by themselves, without departing from the scope of the present invention and regardless of whether they are disclosed in the context of the arrangement or the method.

Further explanations of the invention, advantageous details and features are evident from the following description of the exemplary embodiments of the invention illustrated schematically in FIGS. 1 to 11, or from respective parts thereof.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
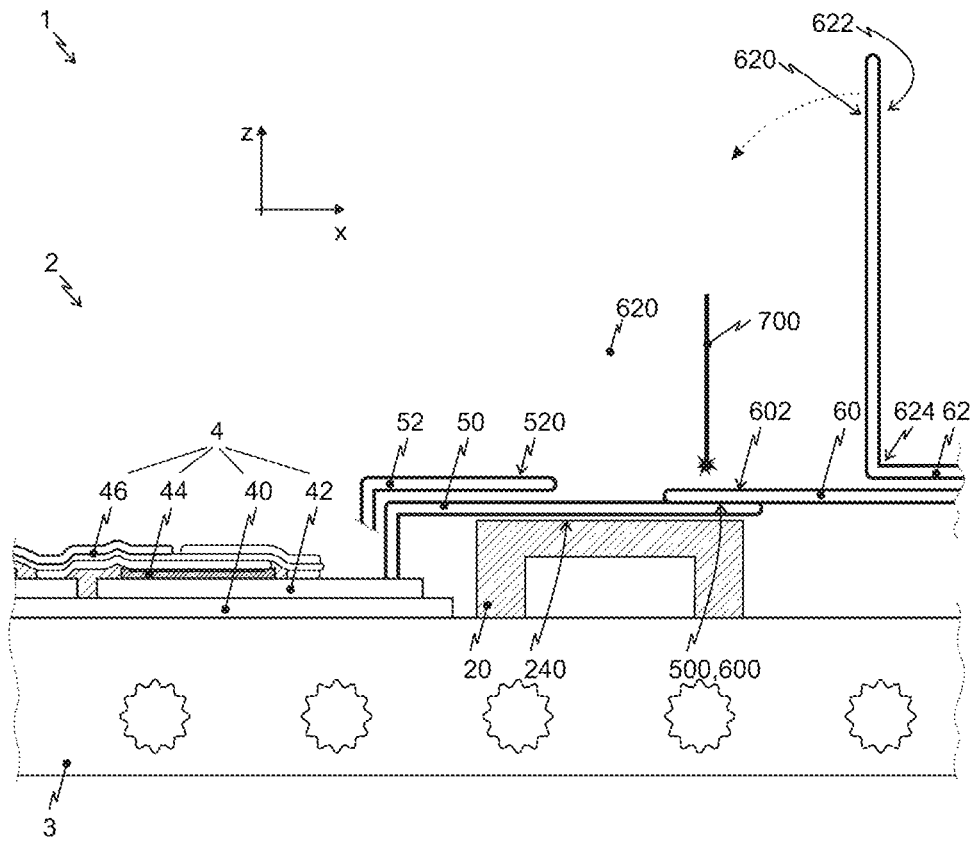
FIG. 1 schematically shows a detail of a first design of a power electronic arrangement in sectional view during method step b).

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 2:
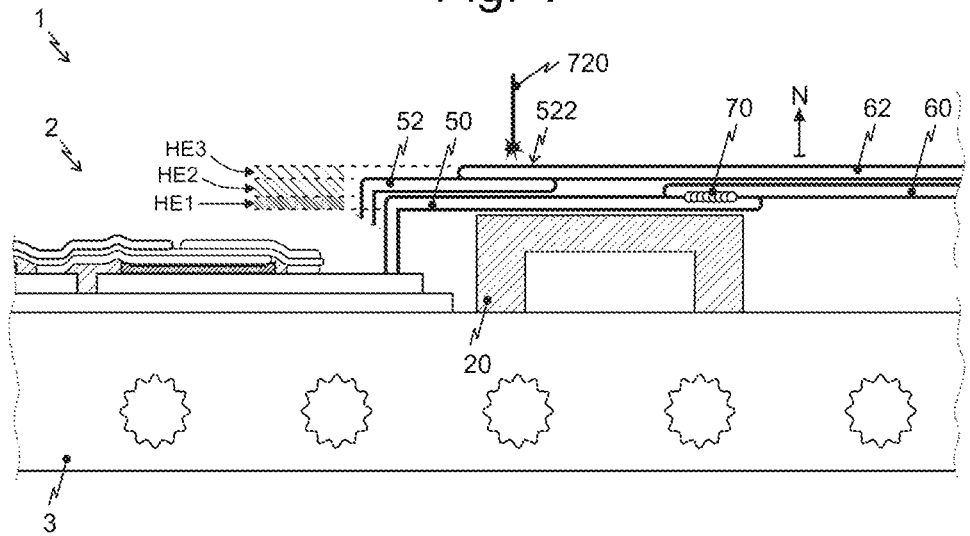
FIG. 2 shows this power electronic arrangement during method step d).

FIG. 1 schematically shows a detail of a first design of a power electronic arrangement 1 in sectional view during the method step b), while FIG. 2 shows this power electronic arrangement 1 during the method step d). Both figures show a power converter module 2 having a switching device 4, which is arranged on a metal base plate 3, here designed as a liquid cooling device. To provide electrical insulation from the liquid cooling device 3 and thermal coupling to the liquid cooling device 3, this switching device 4 has an insulating material body 40, implemented as a ceramic body. On the side facing away from the liquid cooling device 3 this ceramic body 40 has a multiplicity of conductor tracks 42, which in the operation of the switching device 4 have different potentials. One of these conductor tracks 42, a first DC voltage conductor, has a first DC voltage potential, while a further, a second DC voltage conductor track, has a second DC voltage potential. As an example, the switching device 4 forms a power converter circuit.

On at least one of these conductor tracks 42, which together with the insulating material body 40 form the substrate of the switching device 4, power semiconductor devices 44 arranged in a standard manner are connected to form a circuit. The connection in this embodiment is implemented as a standard film composite 46 made from electrically conductive and electrically insulating films stacked alternately.

For external connection, the power converter module 2 has two DC voltage terminal elements 50, 52, which are each connected in an electrically conducting manner to one of the DC voltage conductor tracks 42 carrying DC voltage potential. This connection is implemented in a standard way, in this case without restriction of generality, as a pressure sintering connection. These DC voltage terminal elements 50, 52 are used for the connection to associated DC voltage connection elements 60, 62, which are preferably connected to a capacitor device (see FIG. 6). Before and also during the method step b), the DC voltage connection elements 60, 62 are spaced apart from each other in the region of their respective surface connection sections 600, 620, i.e., those sections which are to be connected to the assigned surface connection sections 500, 520 of the DC voltage terminal elements 50, 52, and are at an angle to each other, here purely as an example a right angle, to each other. This angle is formed by bending the second DC voltage connection element 62 at a bending region 624.

During the method step b), the first DC voltage connection element 50 is already resting on a support surface 240 of the housing 20. The second DC voltage terminal element 52 ends recessed with respect to the first DC voltage connection element 50, with the result that its surface connection section 500 is accessible from above, i.e., in the negative normal direction, i.e., also the negative z-direction. The surface connection section 600 of the first DC voltage connection element 60 was arranged on this in method step a). On its opposite surface is its surface welding section 602. By the action of a first laser beam 700 of a welding laser on this surface welding section 602, a first welding joint 70 is formed, see FIG. 2.

In the following method step c), the surface connection section 620 of the second DC voltage connection element 62 is arranged on the associated surface connection section 520 of the second DC voltage terminal element 52. For this purpose, in the bending region 624 of the second DC voltage connection element 62, the angled section is bent in such a way, represented by the dashed curved arrow, that both DC voltage connection elements 60, 62 again run parallel to each other over the entire length shown.

Figure 4:
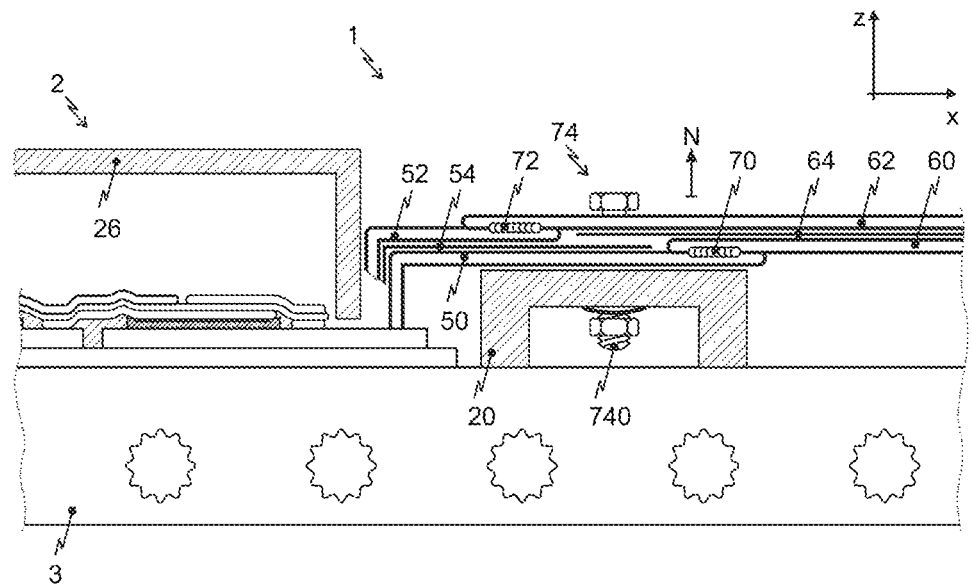
FIG. 4 schematically shows a detail of a second configuration of a power electronic arrangement in a sectional view.

Represented in FIG. 2, the action of a second laser beam 720 of a welding laser on the surface welding section 622 of the second DC voltage connection element 62 now forms a second connection 72, see FIG. 4, thus here a second welding joint, that between the second DC voltage terminal element 52 and the second DC voltage connection element 62.

In the area of the connection between DC voltage terminal elements 50, 52 and DC voltage connection elements 60, 62, the first DC voltage terminal element 50 and the second DC voltage terminal element 52 form a stack, wherein an insulation device 54 is arranged between the two DC voltage terminal elements 50, 52, and shown in exemplary form in FIG. 4. The first DC voltage terminal element 50 rests on the supporting surface 240 of the housing 20, only partially shown, of the power converter module 2. This housing 20 in this design is only implemented as a partial housing 22, and thus does not completely enclose the switching device 4, as would be possible.

In the area of the surface connection section 500 of the first DC voltage terminal element 50, its course is defined by a first main plane HE1. The region of the surface connection section 520 of the second DC voltage terminal element 52 and the surface connection section 600 of the first DC voltage connection element 60 defines a second main plane HE2, directly following the first, in normal direction N, in this case the positive z-direction. The region of the surface connection section 620 of the second DC voltage connection element 62 defines a third main plane HE3, directly following the second in the direction away from the cooling device, thus in the normal direction N.

The housing 20 of the power converter module 2 itself is formed from a high-temperature-resistant plastic, here a polyphenylene sulphide, which also has a high flexural strength. The DC voltage terminal elements 50, 52, as well as the DC voltage connection elements 60, 62, are implemented as thin metal sheets, here more precisely copper sheets, with a thickness of 700 µm. The insulation device 54, 64, both between the DC voltage terminal elements 50, 52 and between the DC voltage connection elements 60, 62, is made from a plastic with high electrical dielectric strength, here from ethylene tetrafluoroethylene copolymer or liquid crystal polymer, with a thickness of 100 µm.

Figure 3:
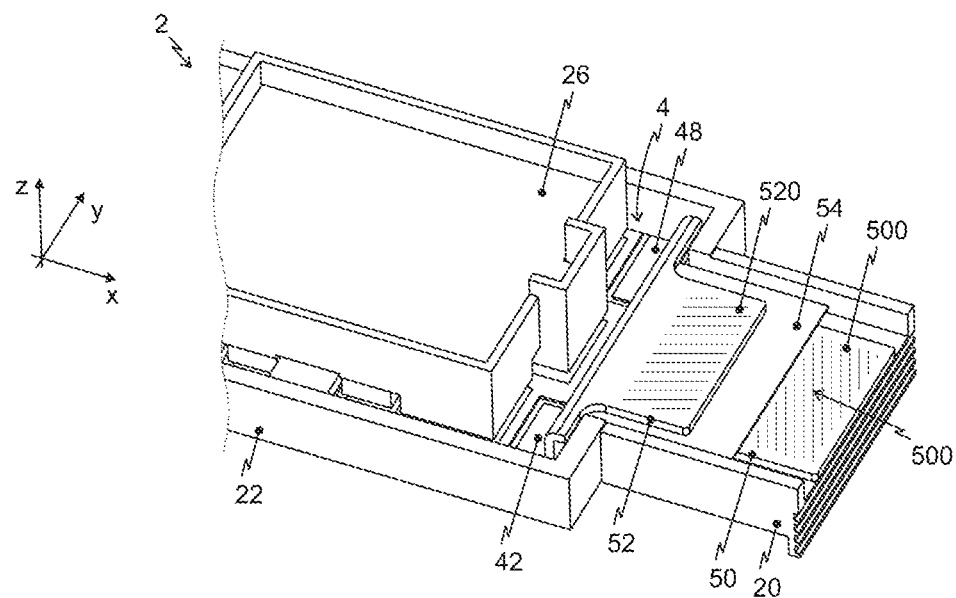
FIG. 3 shows a three-dimensional partial view of a power converter module of a power electronic arrangement according to the invention.

FIG. 3 shows a three-dimensional partial view of a power converter module of a power electronic arrangement according to the invention, as described in FIGS. 1 and 2. Also shown here is a cover element 26 of the housing 20.

Figure 5:
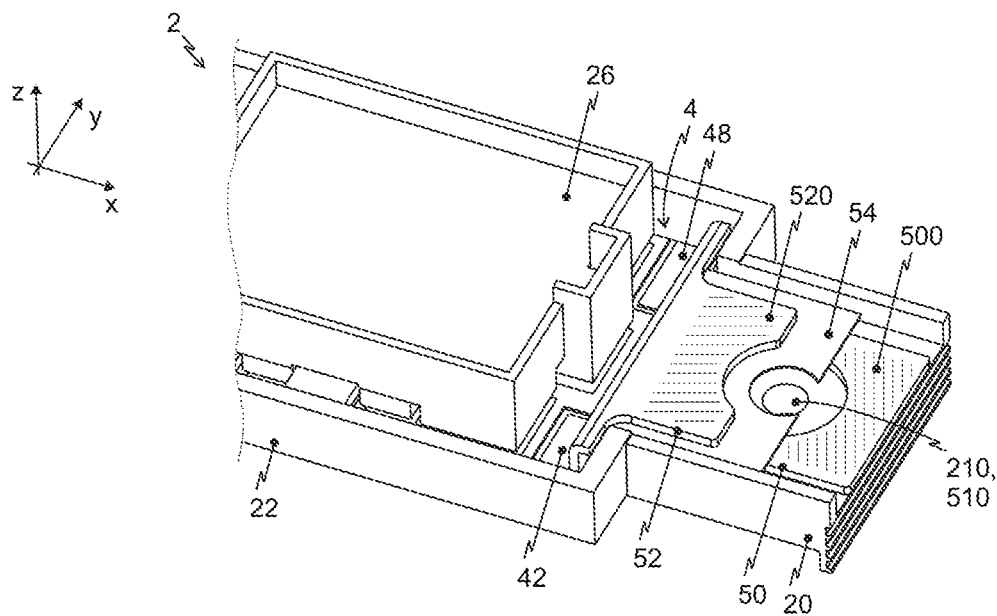
FIG. 5 shows a three-dimensional partial view of the power converter module of this power electronic arrangement according to the invention.
Figure 6:
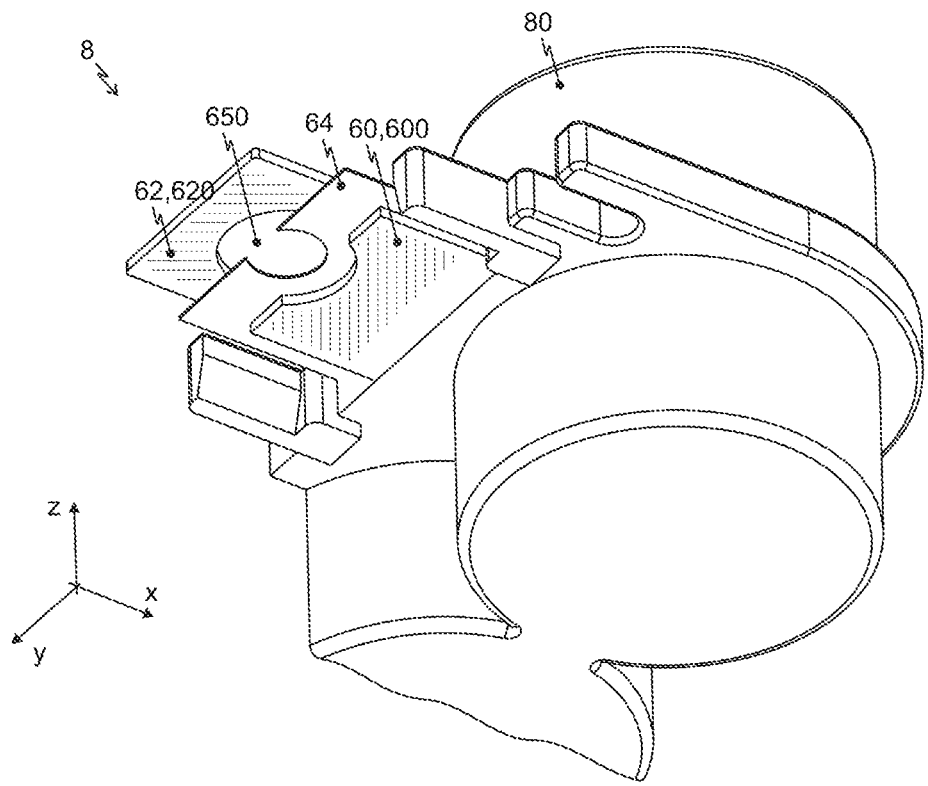
FIG. 6 shows a capacitor device for connecting to this power converter module.

FIG. 4 schematically shows a detail of a second design of a power electronic arrangement 1 in a sectional view. This differs from the first design in that a clamping device 74, which has been implemented as a screw connection 740, is also present here. FIG. 5 shows a three-dimensional partial view of the power converter module 2 of this power electronic arrangement according to the invention. FIG. 6 shows a capacitor device 8 with capacitor elements 80 and DC voltage connection elements 60, 62 for connection to the power converter module.

Here, the first DC voltage terminal element 50 has a first opening 500, the second DC voltage terminal element 52 is recessed relative to this first opening 510 and has a lateral retraction. Similarly, the second DC voltage connection element 62 has a second opening 610, the first DC voltage connection element 52 ends in a recessed position relative to this first opening 510 and has a lateral retraction. Furthermore, the housing 20 also has a third opening 210, which is aligned with the first opening 510. All the openings 210, 510, 650 are arranged in alignment with one another, wherein the screw of the screw connection 740 passes through all the openings 210, 510, 650 and the terminal and connection elements are fixed on the housing 20. Alternatively, but not shown, the screw of the screw connection can also engage in a further opening of the cooling device fitted with an internal thread, and thus additionally fix the power converter module thereto.

Figure 7:
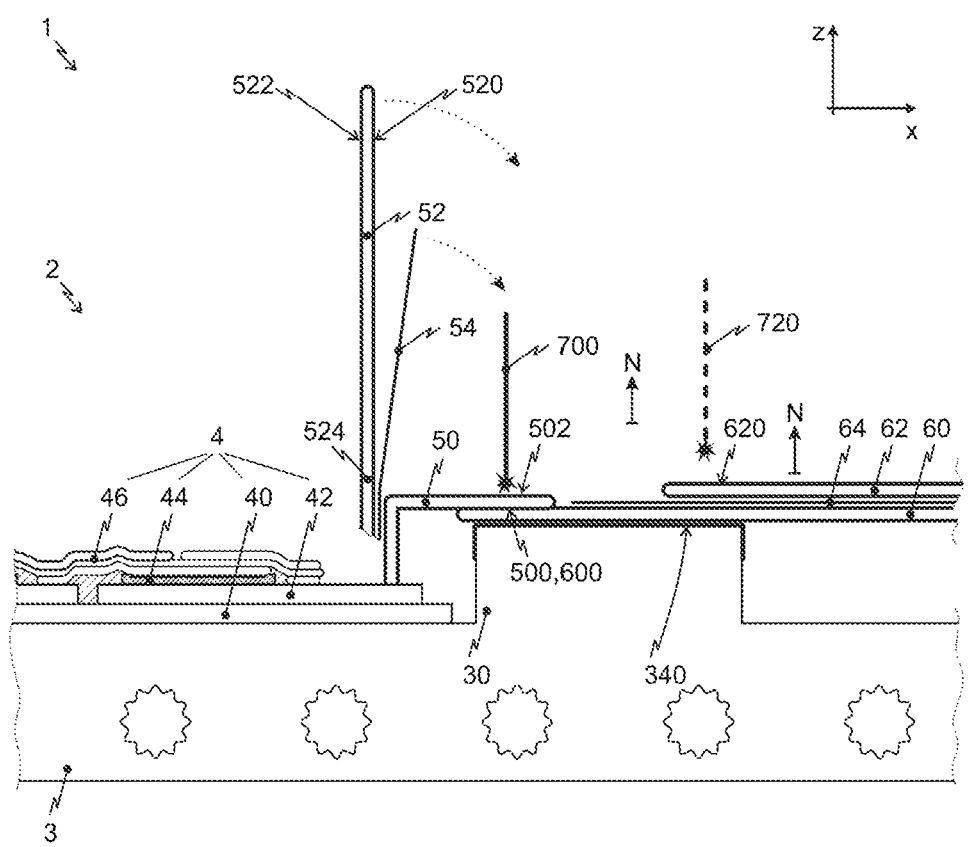
FIG. 7 schematically shows a detail of a third design of a power electronic arrangement in sectional view during method step b).

FIG. 7 schematically shows a detail of a third design of a power electronic arrangement 1 in sectional view during method step b). In contrast to the first design according to FIGS. 1 to 3, the first DC voltage connection element 60 rests on the cooling device 3 in an electrically insulated manner, in fact directly and therefore with excellent thermal conductance. For this purpose, and purely as an example, the cooling device has an elevation 30 with a supporting surface 340.

The first DC voltage terminal element 50 rests with its surface connection section 500 on the surface connection section 600 of the first DC voltage connection element 60. The action of a first laser beam 700 of a welding laser on the surface welding section 602 located opposite the surface connection section 600 of the first DC voltage connection element 60 is used to form a first welding joint.

Directly thereafter, in a method step c) the surface connection section 520 of the second DC voltage terminal element 52 is arranged on the surface connection section 620 of the second DC voltage connection element 62. For this purpose, the second DC voltage terminal element 52 is angled in a bending region 524. At the same time, a first insulation device 54 is also angled and then rests on the first DC voltage terminal element 50 and overlaps this so that it also partly overlaps the second insulation device 64.

In a method step d), the action of a second laser beam 720 of a welding laser on the surface welding section 622 opposite the surface connection section 620 of the second DC voltage connection element 62 then forms a second welding joint between the second DC voltage terminal element 52 and the second DC voltage connection element 62.

Figure 8:
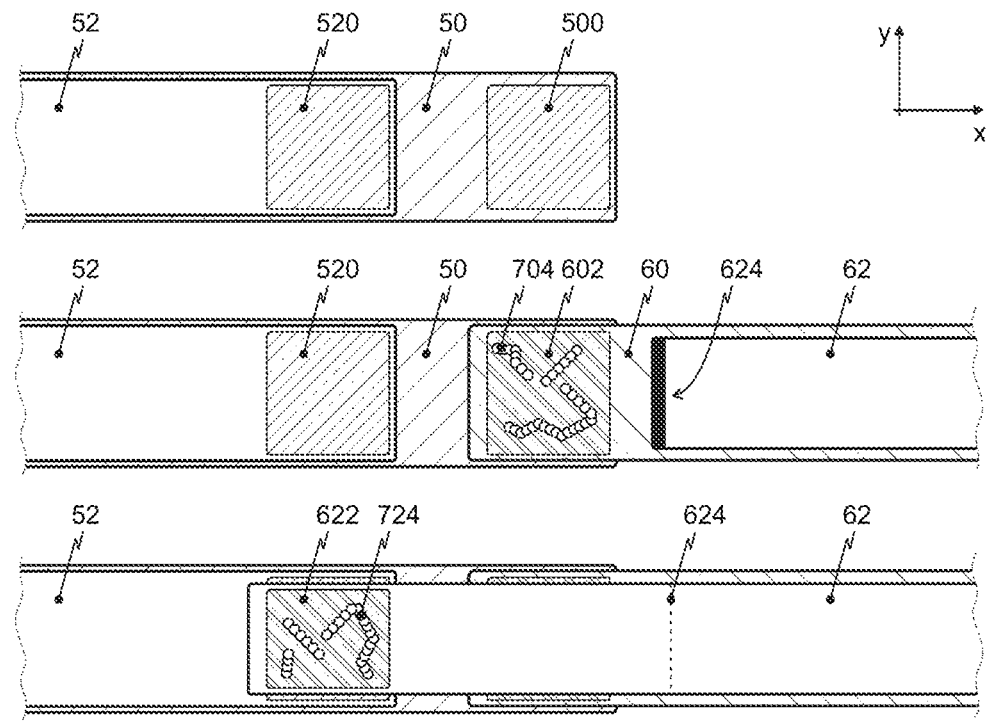
FIG. 8 shows essential steps of the method according to the invention.

FIG. 8 shows the essential steps of the method according to the invention in plan view from the normal direction N, i.e., from the z-direction, onto the terminal and connection elements.

The top part of the figure shows a first DC voltage terminal element 50 with its surface connection section 500, and a second DC voltage terminal element 52 with its surface connection section 520.

In the center, a first DC voltage connection element 60 is additionally shown, which rests with its surface connection section on the surface connection section 500 of the first DC voltage terminal element 50. Also shown is the surface welding section 602 of each first DC voltage connection element 60 opposite the surface connection section 600. The laser track 704, which is created when forming the first connection on this surface welding section 602 by means of laser welding, is also shown.

In some sections the second DC voltage connection element 60 here protrudes from the drawing plane in the normal direction N, and is angled in its bending region 624 for this purpose.

The lower part of the figure shows the second DC voltage connection element 62 after bending at its bending region 624, so that the surface connection section 620 thereof now rests on the surface connection section 520 of the second DC voltage terminal element 52. This connection between these surface connection sections is made by means of laser welding. The laser track 724, which is created when forming the second connection on the surface welding section 622 of the second DC voltage connection element 62, is also shown.

Figure 9:
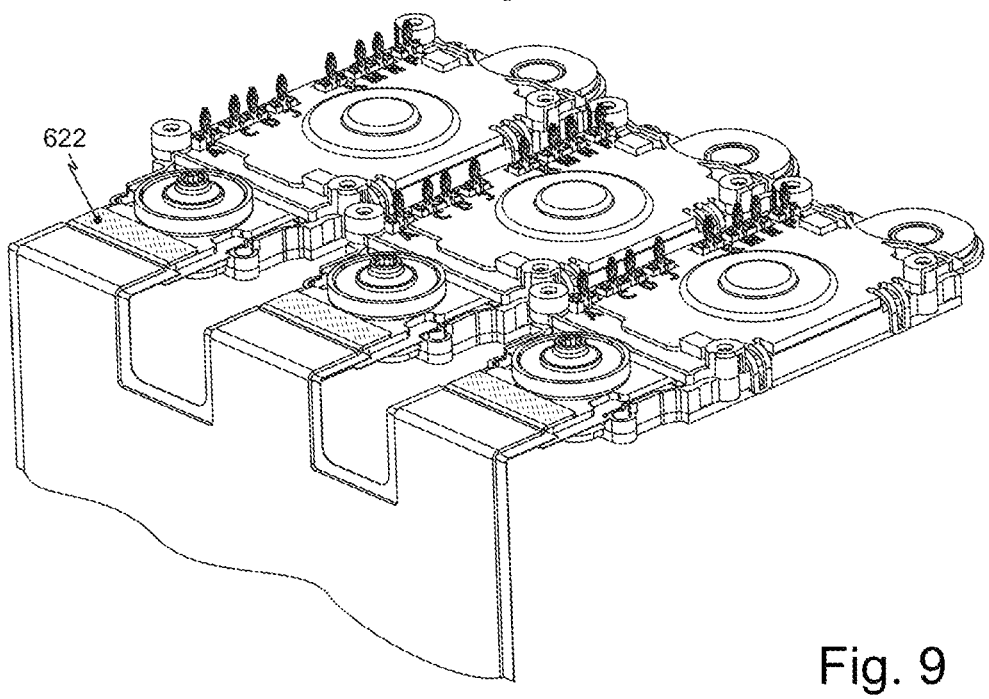
FIG. 9 shows a three-dimensional view of a power electronic arrangement according to the invention.
Figure 10:
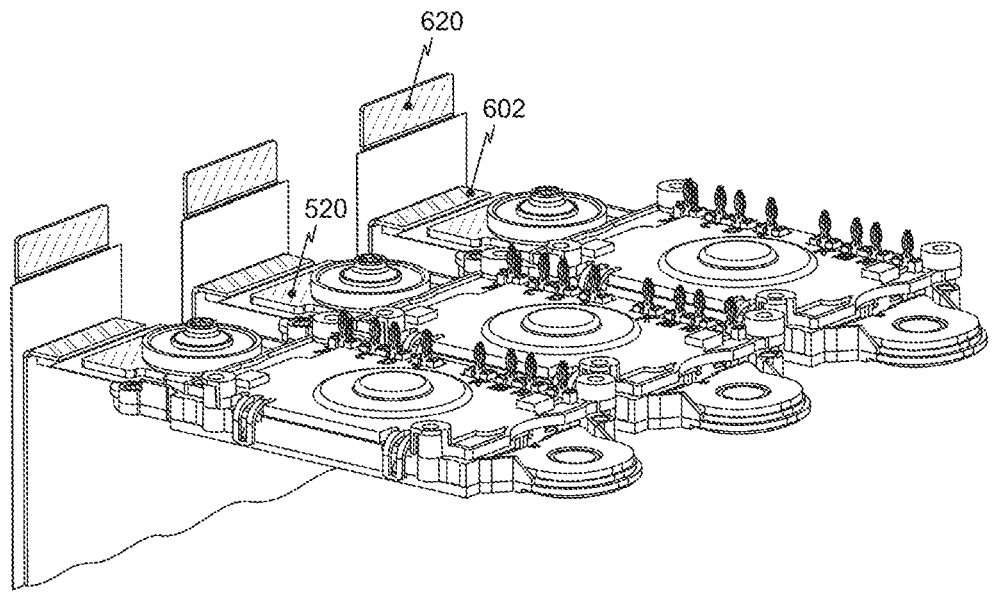
FIGS. 10 and 11 show this power electronic arrangement in perspective and in different three-dimensional views during method step b).
Figure 11:
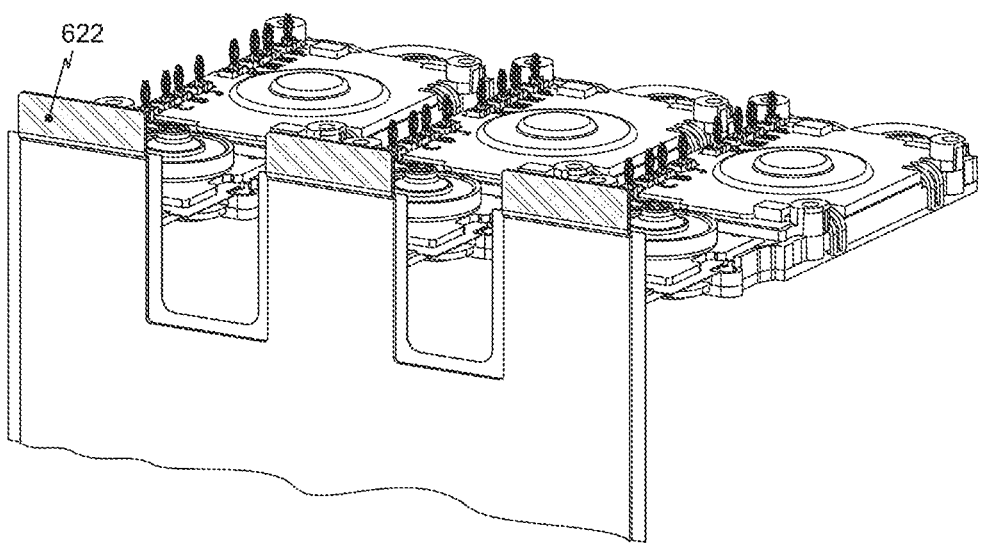

FIG. 9 shows a three-dimensional view of a power electronic arrangement according to the invention. FIGS. 10 and 11 show this power electronic arrangement in different three-dimensional views during method step b). All the essential elements shown are already described above.

It is to be noted that of course features of different exemplary embodiments of the invention can be combined with one another in an arbitrary manner, unless the features are mutually exclusive, without departing from the scope of the invention.

Also, the inventors intend that only those claims which use the specific and exact phrase "means for" are intended to be interpreted under 35 USC 112, sixth paragraph. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic arrangement, comprising:
   a power converter module, further comprising:
   a switching device with a substrate with a first and a second DC voltage conductor track and a first and a second DC voltage terminal element connected thereto in an electrically conducting manner with a respective correct polarity;
   a first and a second DC voltage connection element, wherein the first DC voltage terminal element is connected to the first DC voltage connection element in an electrically conducting manner with said respective correct polarity by means of a respective first materially-bonded connection;

wherein the second DC voltage terminal element is connected to the second DC voltage connection element in an electrically conducting manner with said respective correct polarity by means of a respective second materially-bonded connection, and wherein proximate each of the respective first and the second materially-bonded connections and between the DC voltage terminal element and the associated DC voltage connection element, the first and second DC voltage terminal element, as well as the first and second DC voltage connection element, is formed respective stacks with a respective first and a second insulation device arranged in between them viewed in the normal direction (N);

the first connection is spaced apart from the second connection perpendicular to the normal direction (N);

the first connection and the second connection do not have an overlap region;

either the first DC voltage terminal element or the first DC voltage connection element rests on a supporting device proximate one of the first connection and the second connection; and said supporting device is one of a part of a housing of the switching device and a part of a cooling device;

the first DC voltage terminal element or the first DC voltage connection element is arranged by means of a clamping device on the support device directly adjacent to the first connection; and wherein the clamping device is a threaded connection and with an insulating sleeve at least partially surrounding the clamping device passes in an electrically insulated manner through an opening in the first DC voltage terminal element and also passes through a second opening in the second DC voltage connection element.

2. The power electronic arrangement, according to claim 1, wherein:
each respective said first and said second materially-bonded connection is implemented as a welded joint.

3. The power electronic arrangement, according to claim 1, wherein:
the first DC voltage terminal element is arranged in a first main plane;
the second DC voltage terminal element and the first DC voltage connection element are arranged in a second main plane; and
the second DC voltage connection element is arranged in a third main plane; and
and the first main plane, the second main plane, and the third main planes are stacked in the normal direction (N).

4. The power electronic arrangement, according to claim 1, wherein:
the first DC voltage connection element is arranged in a first main plane;
the second DC voltage connection element and the first DC voltage terminal element are arranged in a second main plane;
the second DC voltage terminal element is arranged in a third main plane; and
the first main plane, the second main plane, and the third main planes are stacked in the normal direction (N).

5. The power electronic arrangement, according to claim 1, wherein:

the respective first and second insulation devices of the respective two stacks overlap each other in the region between the respective first and second materially-bonded connections.

6. The power electronic arrangement, according to claim 1, wherein:
each respective said first and said second DC voltage terminal element is a metal foil sheet, with a thickness of 300 μm to 2000 μm.

7. The power electronic arrangement, according to claim 1, wherein:
each respective said first and said second insulation device is formed of a material selected from a group of plastics with high electrical dielectric strengths including a polyimide, an ethylene tetrafluoroethylene copolymer, and a liquid crystal polymer; and
each said first and said second insulation device has a thickness of 50 μm to 500 μm.

8. The power electronic arrangement, according to claim 1, wherein:
the first and the second DC voltage connection elements form the DC voltage supply of the power converter module; and
the first and the second DC voltage connection elements are part of a capacitor device.

9. A method for producing a power electronic arrangement, comprising the steps of:
providing a power electronic arrangement; comprising:
a power converter module, further comprising:
a switching device with a substrate with a first and a second DC voltage conductor track and a first and a second DC voltage terminal element connected thereto in an electrically conducting manner with a respective correct polarity;
a first and a second DC voltage connection element, wherein the first DC voltage terminal element is connected to the first DC voltage connection element in an electrically conducting manner with said respective correct polarity by means of a respective first materially-bonded connection;
wherein the second DC voltage terminal element is connected to the second DC voltage connection element in an electrically conducting manner with said respective correct polarity by means of a respective second materially-bonded connection; and
wherein proximate each of the respective first and the second materially-bonded connections and between the DC voltage terminal element and the associated DC voltage connection element, the first and second DC voltage terminal element, as well as the first and second DC voltage connection element, is formed respective stacks with a respective first and a second insulation device arranged in between them viewed in the normal direction (N);
the first connection is spaced apart from the second connection perpendicular to the normal direction (N);
the first connection and the second connection do not have an overlap region;
either the first DC voltage terminal element or the first DC voltage connection element rests on a supporting device proximate one of the first connection and the second connection; and said supporting device is one of a part of a housing of the switching device and a part of a cooling device;

the first DC voltage terminal element or the first DC voltage connection element is arranged by means of a clamping device on the support device directly adjacent to the first connection; and wherein the clamping device is a threaded connection and with an insulating sleeve at least partially surrounding the clamping device passes in an electrically insulated manner through an opening in the first DC voltage terminal element and also passes through a second opening in the second DC voltage connection element; and producing a power electronic arrangement by conducting the steps of:

a. arranging the power converter module with the first and the second DC voltage terminal element relative to a capacitor device with the first and the second DC voltage connection elements, in such a way that a surface connection section of the first DC voltage connection element is on an associated surface connection section of the first DC voltage terminal element, and that a surface connection section of the first DC voltage terminal element or of the first DC voltage connection element is located opposite an associated surface welding section and is accessible to an external welding device;

b. forming the first connection by welding the first DC voltage connection element to the first DC voltage terminal element;

c. arranging a surface connection section of the second DC voltage connection element on an associated surface connection section of the second DC voltage terminal element; and d. forming the second connection by welding the second DC voltage connection element to the second DC voltage terminal element on a second surface welding section.

10. The method according to claim 9, wherein:

during the step (a) the DC voltage terminal elements or the DC voltage connection element are arranged a distance apart in the region of their respective surface connection sections and are at an angle relative to each other.

11. The method according to claim 10, wherein:

in step c), the second DC voltage terminal element or the second DC voltage connection element is bent in a bending region.

12. The method according to claim 11, wherein:

in the step d) the respective welding is a laser welding process.

* * * * *